(12) United States Patent
Seo

(10) Patent No.: US 7,706,761 B2
(45) Date of Patent: Apr. 27, 2010

(54) POWER AMPLIFYING CIRCUIT IN MOBILE TERMINAL

(75) Inventor: Ho-Soo Seo, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 636 days.

(21) Appl. No.: 11/202,572

(22) Filed: Aug. 12, 2005

(65) Prior Publication Data

US 2006/0046667 A1     Mar. 2, 2006

(30) Foreign Application Priority Data

Aug. 27, 2004    (KR) .................... 10-2004-0068141

(51) Int. Cl.
*H01Q 11/12*      (2006.01)
(52) U.S. Cl. ................. 455/127.2; 455/126; 455/127.1; 455/527; 330/297
(58) Field of Classification Search .............. 455/127.2
See application file for complete search history.

(56) References Cited

U.S. PATENT DOCUMENTS 6,624,702 B1 * 9/2003 Dening ....................... 330/297

7,505,742 B2 * 3/2009 Sharp et al. ............... 455/127.1

FOREIGN PATENT DOCUMENTS

KR     10-2001-0038111         5/2001

\* cited by examiner

*Primary Examiner*—Duc Nguyen
*Assistant Examiner*—Ajibola Akinyemi
(74) *Attorney, Agent, or Firm*—The Farrell Law Firm, LLP

(57) ABSTRACT

The present invention relates to a power amplifying circuit of a mobile terminal and, more particularly, to a voltage gain control circuit in a mobile terminal which is capable of acquiring a variable voltage gain. The present invention includes a transceiver controller to produce a voltage gain control signal and transforming analog and digital signals; a first driving voltage controller for generating a reference voltage for a predetermined voltage gain according to the voltage gain control signal; a DC voltage transformer for transforming source voltage into a first driving voltage according to the reference voltage of the first driving voltage controller; a second driving voltage controller for generating a second driving voltage according to the voltage gain control signal; and a power amplifier for generating a predetermined voltage gain according to the first driving voltage supplied by the DC voltage transformer and the second driving voltage supplied by the second driving voltage controller.

10 Claims, 6 Drawing Sheets

POWER AMPLIFYING CIRCUIT IN MOBILE TERMINAL

PRIORITY

This application claims priority under 35 U.S.C. §119 to an application entitled "The Voltage Gain Control Circuit in Mobile-Phone" filed in the Korean Intellectual Property Office on Aug. 27, 2004 and assigned Serial No. 2004-0068141, the contents of which are hereby incorporated by reference.

BACKGROUND OF THE INVENTION

1. Field of the Invention

The present invention relates to a power amplifying circuit of a transmitter in a mobile terminal and, more particularly, to a voltage gain control circuit in a mobile terminal, which is capable of acquiring a variable voltage gain.

2. Description of the Related Art

Mobile terminal technology is continuously developing due to the development of the IT technology. Communication technology is developing from first generation technology AMPS (advanced mobile phone service), second generation technology CDMA (code-division multiple access) and GSM (global system for mobile communication), to third generation technology WCDMA (wideband CDMA).

In comparison to the first generation AMPS mobile terminals, the second generation CDMA (code-division multiple access) and GSM (global system for mobile communication) mobile terminals have been reduced in size, and have increased in total usage time and call quality.

In the third generation technology WCDMA (wideband CDMA), it is possible to provide not only voice data transmission services but also image information transmission services. Data transmission speeds have been greatly increased over the second generation CDMA and GSM terminals.

However, for the high-speed transmission of data, the power consumption of a mobile terminal has, also increased, which caused reduction in, total usage time of the battery and, problem in the mobile terminals.

FIG. 1A is a block diagram illustrating an embodiment of a conventional power amplifying circuit. As shown in FIG. 1A, power amplifier 100 amplifies a transmission signal according to a predetermined voltage gain. Then, power amplifier 100 sends the amplified signal to a duplexer, (not shown) to transmit the signal, over the air. Transmission signal processing block (TxIC) 120 performs an RF transformation of a baseband processing signal received from transceiver controller 110, and then inputs the transformed signal to power amplifier 100.

Battery 130 supplies a uniform driving voltage to the power amplifier 100. Transceiver controller 110 sends either an on or off control signal to power amplifier driving switch 140 according to a power amplifier driving signal.

When power amplifier driving switch 140 turns on, power amplifier control voltage Vcon is sustained at a uniform voltage level and is supplied to power amplifier 100. Accordingly, in FIG. 1A, power amplifier 100 has a fixed voltage gain that is determined by a constant voltage from battery 130 and power amplifier control voltage Vcon.

FIG. 1B is a block diagram illustrating another embodiment of a conventional power amplifying circuit. Unlike FIG. 1A, FIG. 1B shows that the power amplifier control voltage Vcon is controlled by a voltage gain control signal from the transceiver controller 110.

As shown in FIG. 1B, power amplifier 100 amplifies a transmission signal according to the voltage gain that is determined by the voltage gain control signal of transceiver controller 110. In this case, a PDM (pulse density modulation) signal may be used as the voltage gain control signal.

Transmission signal processing block (TxIC) 120 performs an RF transformation of a baseband processing signal received from the transceiver controller 110, and then inputs the transformed signal to the power amplifier 100.

The battery 130 supplies a uniform driving voltage to the power amplifier 100. The power amplifier driving switch 140 sends either an on or off control signal to power amplifier 100. Filter 150 reduces the possibility of a voltage gain error by eliminating unnecessary noises.

When the power amplifier driving switch 140 turns on, the power amplifier control voltage Vcon is determined by the voltage gain control signal of the transceiver controller 110. Thus, the voltage gain of power amplifier 100 varies as the voltage gain control signal varies.

FIG. 1C is a block diagram illustrating still another embodiment of a conventional power amplifying circuit. In FIG. 1C, unlike to FIG. 1A and FIG. 1B, the power amplifier control voltage Vcon of the power amplifier 100 is supplied through a separate voltage scaling circuit 160. In other words, the power amplifier control voltage Vcon is a transformed value of the voltage gain control signal of the transceiver controller 110. The transmission signal processing block 120 transforms the baseband processing signal and the voltage gain control signal into a transmission level, and then inputs the transformed signals to the power amplifier 100.

Meanwhile, the voltage scaling circuit 160 transforms the voltage gain control signal into a signal for acquiring a desired voltage gain, and then inputs the transformed signal to the power amplifier 100. The power amplifier 100 can acquire a desired voltage gain by the power amplifier control voltage Vcon.

The battery 130 supplies a source voltage to the power amplifier 100. The transceiver controller 110 sends an on or off control signal to the power amplifier driving switch 140 according to the power amplifier driving signal. The transceiver controller 110 supplies a voltage gain control signal to the power amplifier 100 through the filter 150 for eliminating noises to avoid the occurrence of a voltage gain error.

In FIG. 1C, the voltage gain control signal supplied by the transceiver controller 110 determines the output signal of the transmission signal processing block 120 and the output signal of the voltage scaling circuit 160. The voltage gain varies according to the output signals. Thus, a desired voltage gain can be acquired by controlling the output signals of transmission signal processing block 120 and voltage scaling circuit 160.

In the prior art, a battery voltage decreases with the lapse of time, and thus, the efficiency of the power amplifier also gradually decreases. The decrease in the efficiency of the power amplifier leads to a reduction in time the battery can be used (i.e., battery life) and creates the heating problem of a mobile terminal. Accordingly, in the prior art, the efficiency of power amplifier varies, based on the battery voltage variation.

Table 1 shows a current flow according to the relation of the battery voltage Vbat and the power amplifier control voltage Vcon, when the battery voltage Vbat is applied as an external source voltage Vcc and no input signal is applied.

TABLE 1

| | | \multicolumn{10}{c}{Vcon (V)} | | | | | | | | | |
|---|---|---|---|---|---|---|---|---|---|---|---|
| | | 1.6 | 1.7 | 1.8 | 1.9 | 2.0 | 2.1 | 2.2 | 2.3 | 2.4 | 2.5 |
| Vcc(V) | 3.0 | 0.014 | 0.016 | 0.019 | 0.021 | 0.023 | 0.026 | 0.028 | 0.030 | 0.033 | 0.035 |
| | 3.2 | 0.014 | 0.017 | 0.020 | 0.022 | 0.025 | 0.027 | 0.029 | 0.031 | 0.033 | 0.036 |
| | 3.4 | 0.015 | 0.018 | 0.021 | 0.024 | 0.026 | 0.028 | 0.030 | 0.033 | 0.035 | 0.037 |
| | 3.6 | 0.017 | 0.019 | 0.022 | 0.025 | 0.027 | 0.030 | 0.032 | 0.034 | 0.036 | 0.038 |
| | 3.8 | 0.017 | 0.020 | 0.023 | 0.026 | 0.029 | 0.031 | 0.034 | 0.036 | 0.038 | 0.040 |
| | 4.0 | 0.018 | 0.021 | 0.025 | 0.028 | 0.030 | 0.033 | 0.036 | 0.038 | 0.040 | 0.042 |
| | 4.2 | 0.018 | 0.022 | 0.025 | 0.029 | 0.032 | 0.034 | 0.037 | 0.040 | 0.042 | 0.044 |
| | 4.4 | 0.019 | 0.022 | 0.026 | 0.029 | 0.033 | 0.036 | 0.038 | 0.041 | 0.044 | 0.046 |

As shown in table 1, a uniform current flows according to the relation of external source voltage Vcc and the power amplifier control voltage Vcon, when no input is applied.

In this case, experiments show that the efficiency of the power amplifier is highest when the external source voltage Vcc is between 3.4 V and 4.2 V. In particular, the difference of the efficiency is over a few percentage points (%) when the battery voltages are 4.2V and 3.2V.

SUMMARY OF THE INVENTION

Accordingly, to increase the voltage gain of a power amplifier, it is important to sustain the most efficient voltage. The prior art still has the problem that the decrease in the efficiency of a power amplifier causes a reduction in battery life and creates the heat problem of a mobile terminal.

It is, therefore, the least an object of the present invention to increase the battery life and minimize the heat problem of a mobile terminal by controlling the voltage gain of a power amplifying circuit in a mobile terminal.

According to the present invention, there is provided a power amplifying circuit, that includes a transceiver controller for generating a voltage gain control signal; a first driving voltage controller for generating a reference voltage to acquire a predetermined voltage gain according to the voltage gain control signal; a DC voltage transformer for transforming a source voltage into a first driving voltage according to the reference voltage of the first driving voltage controller; a second driving voltage controller for generating a second driving voltage according to the voltage gain control signal; and a power amplifier for generating a predetermined voltage gain according to the first driving voltage supplied by the DC voltage transformer and the second driving voltage supplied by the second driving voltage controller.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout the specification.

Figure 1A:
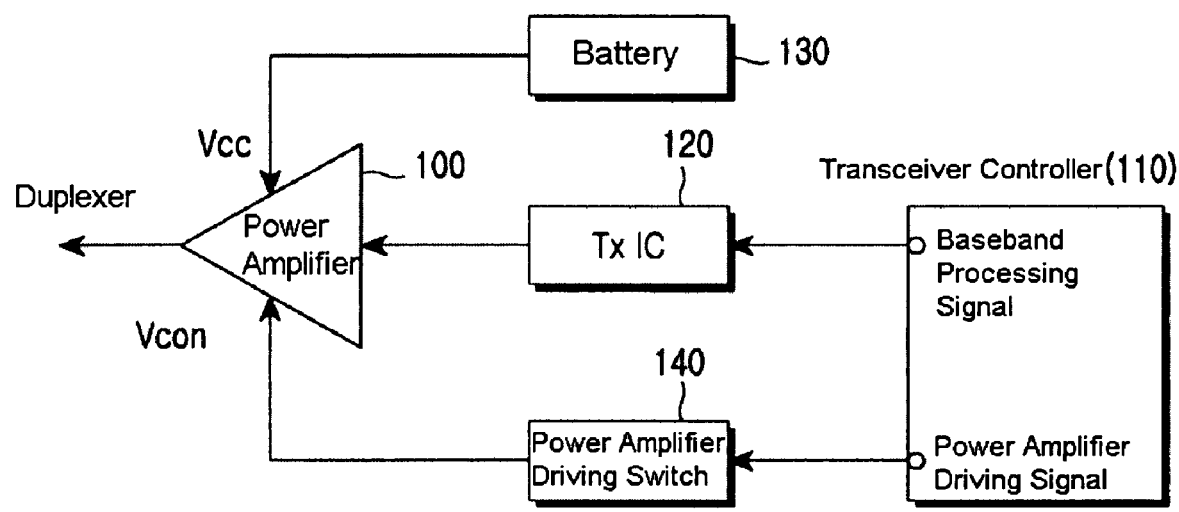
FIG. 1A is a block diagram illustrating an embodiment of a conventional power amplifying circuit.
Figure 1B:
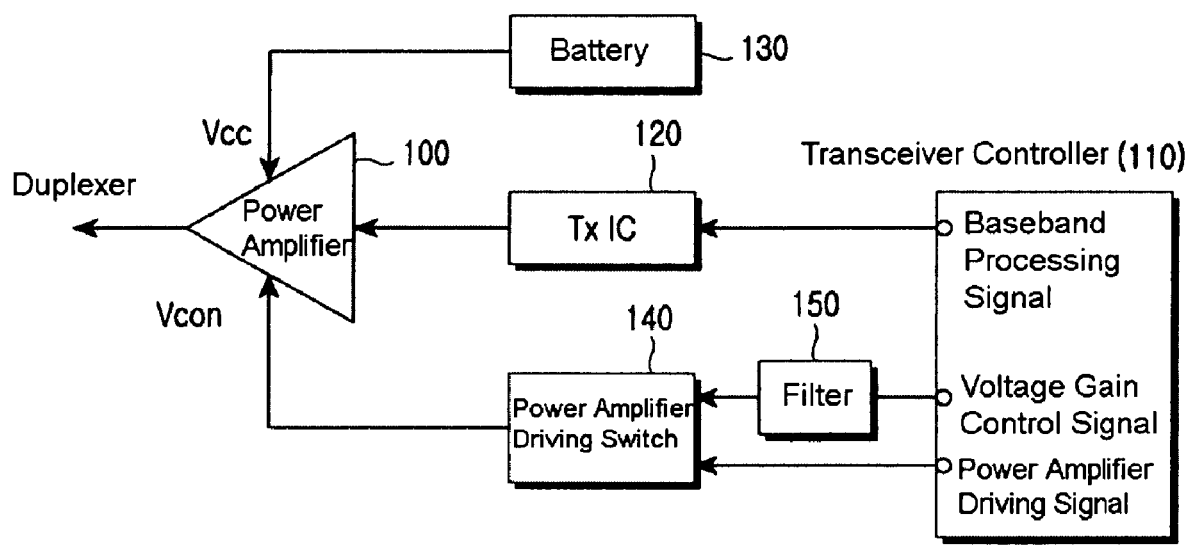
FIG. 1B is a block diagram illustrating another embodiment of a conventional power amplifying circuit.
Figure 1C:
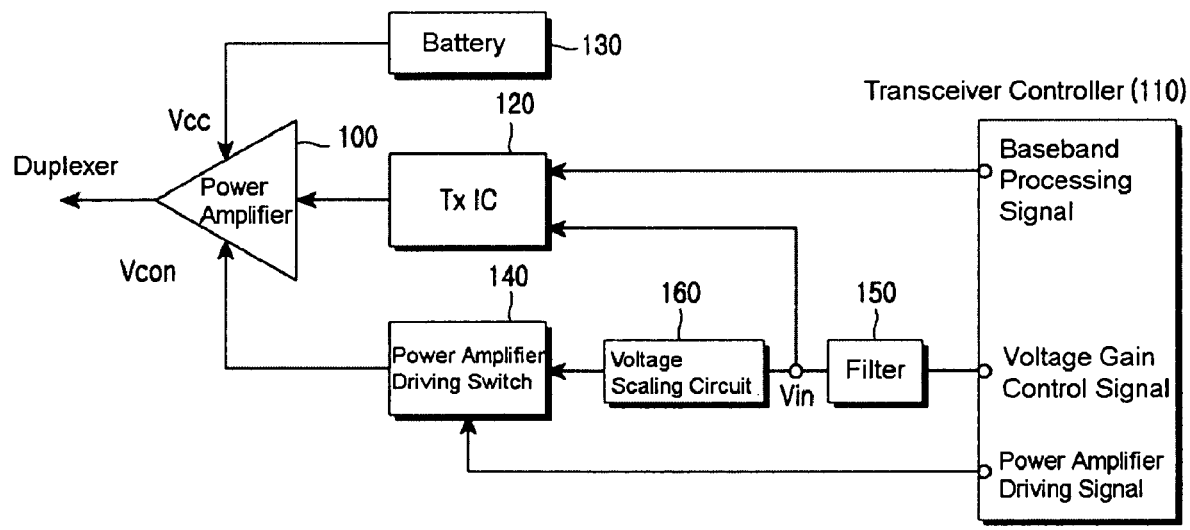
FIG. 1C is a block diagram illustrating still another embodiment of a conventional power amplifying circuit.
Figure 2:
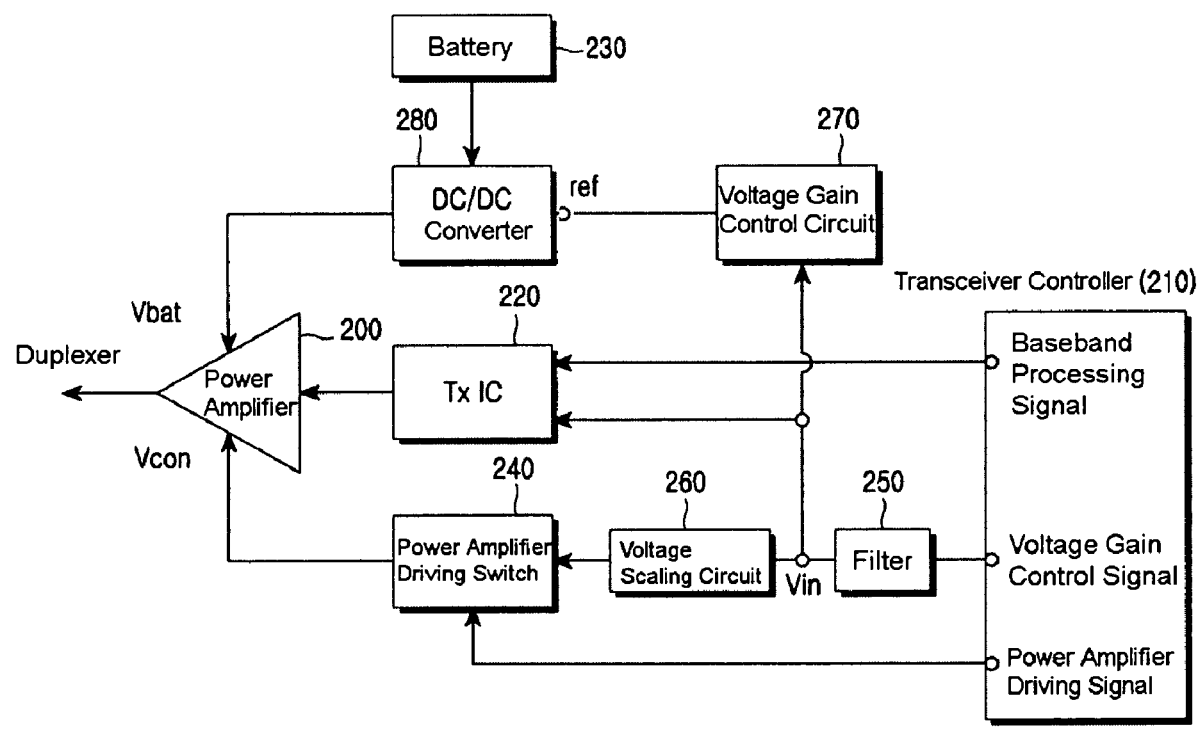
FIG. 2 is a block diagram illustrating a power amplifying circuit according to the present invention.

FIG. 2 is a block diagram illustrating a power amplifying circuit according to the present invention. As shown, the present invention simultaneously controls both an output voltage of a DC/DC converter 280 that is a first driving voltage, and the power amplifier control voltage Vcon that is a second driving voltage, according to the same voltage gain control signal that is output from a transceiver controller 210.

In particular, the present invention provides a voltage gain control circuit 270 that is a first driving voltage controller for generating a variable reference voltage according to the voltage gain control signal of the transceiver controller 210.

The DC/DC converter 280 that is a DC current transformer transforms a source voltage into a first driving voltage according to the variable reference voltage of voltage gain control circuit 270. A voltage scaling circuit 260 that is a second driving voltage controller generates a second driving voltage that is variable, according to the voltage gain control signal of the transceiver controller 210.

The voltage gain control circuit 270 according to the present invention is controlled by the voltage gain control signal of the transceiver controller 210, in the same way as the voltage scaling circuit 260. Also, the voltage gain of the power amplifier 200 is determined by both the output of the voltage gain control circuit 270 and the output of the voltage scaling circuit 260.

The output of the voltage gain control circuit 270 is applied as a reference voltage Vref to the DC/DC converter 280. The DC/DC converter 280 transforms the voltage supplied from the battery 230 into a voltage capable of acquiring a desired voltage gain.

The power amplifier control voltage Vcon of the power amplifier 200 is supplied through the voltage scaling circuit 260. The power amplifier control voltage Vcon is a transformed value of the voltage gain control signal of the transceiver controller 210.

The Transmission signal processing block 220 transforms the baseband processing signal and the voltage gain control signal into a transmission level, and then inputs the transformed signals to the power amplifier 200.

In this case, the voltage scaling circuit 260 transforms the voltage gain control signal into a signal for acquiring a desired voltage gain, and then inputs the transformed signal to the power amplifier 200.

The power amplifier 200 can acquire a desired voltage gain by both the power amplifier control voltage Vcon and the transformed source voltage Vbat supplied from the DC/DC converter 280.

The battery 230 supplies the power amplifier 200 with the source voltage. The power amplifier driving circuit 240 sends an on or off command signal to the power amplifier 200. The filter 250 removes the possibility of a voltage gain error by eliminating unnecessary noise.

In FIG. 2, the voltage gain control signal supplied from the transceiver controller 210 determines the output of the voltage gain control circuit 270, as well as both the output of voltage scaling circuit 260 and the output of the transmission signal processing block 220.

The voltage gain of power amplifier 200 varies according to both the output (Vbat) of the DC/DC converter 280 determined by voltage gain control circuit 270 and the output (Vcon) of the voltage scaling circuit 260 determined by the voltage gain control signal. A desired voltage gain may be acquired by controlling the outputs Vbat and Vcon.

The battery 230 supplies the power amplifier 200 with the source voltage. The source voltage supplied by the battery 230 gradually decreases with the lapse of time. Thus, despite the decrease of the source voltage, to obtain the optimal voltage gain, a uniform voltage should be supplied to the power amplifier 200. Despite the decrease of the source voltage, the DC/DC converter 280 is capable of acquiring a desired voltage gain by supplying the power amplifier 200 with a uniform voltage.

As described above, the present invention provides a separate voltage gain control circuit 270, which makes it possible to acquire the voltage gain, depending not only on Vcon which is the output of the voltage scaling circuit 260 but also on the output of the voltage gain control circuit 270. In other words, the power amplifier 200 of the present invention can acquire a desired voltage gain by simultaneously controlling both the source voltage Vbat and the power amplifier control voltage Vcon through the same voltage gain control signal.

According to the present invention, the power amplifier 200 can acquire a desired voltage gain, by controlling the voltage gain control signal not only through the voltage scaling circuit 260 but also through the voltage gain control circuit 270.

Figure 3A:
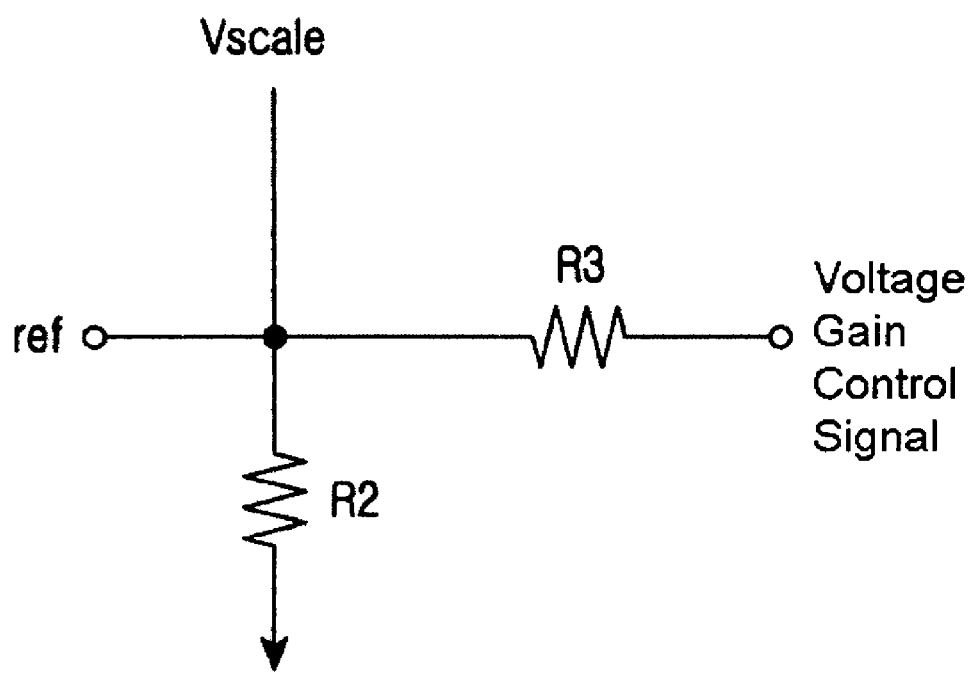
FIG. 3A is a diagram of a voltage gain control circuit according to an embodiment of the present invention.
Figure 3B:
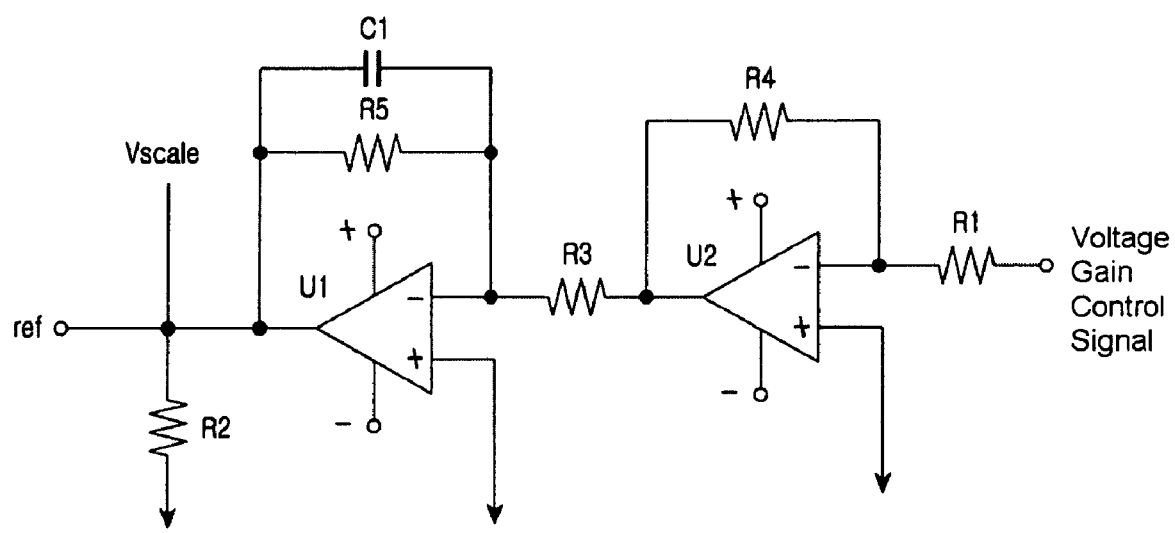
FIG. 3B is a diagram of a voltage gain control circuit according to another embodiment of the present invention.

FIG. 3A is a diagram of a voltage gain control circuit according to an embodiment of the present invention, and FIG. 3B is a diagram of a voltage gain control circuit according to another embodiment of the present invention. After receiving the voltage gain control signal from the transceiver controller, the voltage gain control circuit according to the present invention transmits the signals which are transformed by the circuits configured in FIG. 3A and FIG. 3B to the DC/DC converter that is coupled to terminal ref. In this case, an additional voltage Vscale may be applied for voltage scaling.

The voltage gain control circuit according to the present invention may be implemented by only resistors as shown in FIG. 3A, or by resistors and power amplifier as shown in FIG. 3B.

In FIG. 3A, the voltage gain control circuit comprises a first resistor serially coupled to a voltage gain control signal and a second resistor connected in parallel to the voltage gain control signal. In FIG. 3B, the voltage gain control circuit comprises a plurality of resistors and a plurality of power amplifiers.

As described above, the power amplifier can implement a desired voltage gain when the output of the voltage gain control circuit is applied to the DC/DC converter that is coupled to terminal ref. The output of the voltage gain control circuit configured in FIG. 3A and FIG. 3B varies according to the circuit configuration. Different circuit configurations determine the different outputs of circuit. The output of voltage gain control circuit is applied to a DC/DC converter as a reference voltage.

Finally, after transforming the source voltage into the level Vbat, the DC/DC converter 280 transmits Vbat to the power amplifier 200. In this case, a desired voltage gain can be acquired by simultaneously controlling both the source voltage and the power amplifier control voltage with the same voltage gain control signal.

Consequently, the present invention provides a power amplifying circuit in a mobile terminal, which increases the battery life and minimizes the heat problem by controlling the voltage gain of a power amplifier.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A power amplifying circuit, comprising:
a transceiver controller for generating a voltage gain control signal;
a first driving voltage controller for generating a reference voltage to produce a voltage gain based on the voltage gain control signal;
a DC voltage transformer for transforming a source voltage into a first driving voltage according to the reference voltage of the first driving voltage controller;
a second driving voltage controller for generating a second driving voltage according to the voltage gain control signal; and
a power amplifier for amplifying at a voltage gain according to the first driving voltage supplied by the DC voltage transformer and the second driving voltage supplied by the second driving voltage controller.

2. The power amplifying circuit of claim 1, wherein the transceiver controller controls the receiving and transmitting operations in a mobile terminal and converts analog and digital signals.

3. The power amplifying circuit of claim 1, wherein the DC voltage transformer outputs the first driving voltage according to the reference voltage independent of the output signal of source voltage.

4. The power amplifying circuit of claim 1, wherein the first driving voltage controller consists of resistors.

5. The power amplifying circuit of claim 4, wherein the first driving voltage controller comprises a first resistor coupled serially to the voltage gain control signal and a second resistor connected in parallel to the voltage gain control signal.

6. The power amplifying circuit of claim 1, wherein the first driving voltage controller comprises at least one power amplifier.

7. The power amplifying circuit of claim 6, wherein the first driving voltage controller comprises a plurality of power amplifiers and a plurality of resistors.

8. A mobile terminal including a power amplifying circuit, comprising:
- a transceiver controller for generating a voltage gain control signal;
- a first driving voltage controller for generating a reference voltage to produce voltage gain according to the voltage gain control signal;
- a DC voltage transformer for transforming a source voltage into a first driving voltage according to the reference voltage of the first driving voltage controller;
- a second driving voltage controller for generating a second driving voltage according to the voltage gain control signal; and
- a power amplifier for amplifying of a voltage gain according to the first driving voltage supplied by the DC voltage transformer and the second driving voltage supplied by the second driving voltage controller.

9. The mobile terminal of claim 8, wherein the transceiver controller controls the receiving and transmitting operations in the mobile terminal and converts analog and digital signals.

10. The mobile terminal of claim 8, wherein the DC voltage transformer outputs the first driving voltage according to the reference voltage, independent of the output signal of source voltage.

* * * * *